United States Patent
Anzou

(10) Patent No.: US 7,890,823 B2
(45) Date of Patent: Feb. 15, 2011

(54) NONVOLATILE SEMICONDUCTOR MEMORY SYSTEM

(75) Inventor: Kenichi Anzou, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 275 days.

(21) Appl. No.: 12/120,538

(22) Filed: May 14, 2008

(65) Prior Publication Data

US 2008/0288838 A1 Nov. 20, 2008

(30) Foreign Application Priority Data

May 15, 2007 (JP) ............................ P2007-129720

(51) Int. Cl.
G01R 31/3177 (2006.01)
G01R 31/40 (2006.01)
(52) U.S. Cl. ...................... 714/726; 714/718
(58) Field of Classification Search ........................ None
See application file for complete search history.

(56) References Cited

U.S. PATENT DOCUMENTS 5,991,909 A * 11/1999 Rajski et al. ................. 714/729

| 2005/0055617 | A1* | 3/2005 | Wang et al. ................ 714/727 |
| 2005/0149799 | A1* | 7/2005 | Hemia et al. ............... 714/726 |
| 2005/0172192 | A1* | 8/2005 | Han .......................... 714/726 |
| 2007/0234169 | A1  | 10/2007 | Rajski et al. |
| 2007/0260952 | A1* | 11/2007 | Devanathan et al. ....... 714/726 |

OTHER PUBLICATIONS

Rajski, et al., Embedded Deterministic Test for Low Cost Manufacturing Test, Proc. International Test Conference 2002, p. 301-310, 2002.

* cited by examiner

Primary Examiner—Robert Beausoliel
Assistant Examiner—Dipakkumar Gandhi
(74) Attorney, Agent, or Firm—Turocy & Watson, LLP

(57) ABSTRACT

According to one embodiment, an electrical package includes: an external input portion; an external output portion; a plurality of integrated circuits that is compatible with a compressed deterministic pattern test, each of the integrated circuits including: an input portion; a decompressor that is connected to the input portion; scan chains that are connected to the decompressor; a compactor that is connected to the scan chains; a selector that is connected to the compactor and the input portion to selectively output an output of the compactor or an output of the input portion; and an output portion that is connected to the selector.

11 Claims, 13 Drawing Sheets

NONVOLATILE SEMICONDUCTOR MEMORY SYSTEM

CROSS-REFERENCE TO RELATED APPLICATIONS

This application is based upon and claims the benefit of priority from Japanese Patent Application No. 2007-129720, filed May 15, 2007, the entire contents of which are incorporated herein by reference.

BACKGROUND OF THE INVENTION

The present invention relates to an electrical package.

In design for testability for a semiconductor integrated circuit including a large scale logic circuit, conventionally, a scan test technique and a BIST (Built In Self Test) technique have been used. In recent years, compressed deterministic pattern test technique has often been used.

The compressed deterministic pattern test is a technique for loading compressed deterministic patterns pre-computed by automatic test pattern generation (ATPG) tool via external scan input terminals of a semiconductor integrated circuit having a number of scan chains more than the number of the external inputs, decompressing the compressed test data through an decompressor located in the semiconductor integrated circuit and distributing the decompressed test data into the respective internal scan chains, executing the scan test through the respective scan chains, and then compressing a result of the execution by a compactor located in the semiconductor integrated circuit and unload the result of the compression to a number of scan output terminals less than the number of the internal scan chains. The result of the compression which is thus output is compared with an expected value in pattern memory in an LSI tester and it is decided whether logic in the semiconductor integrated circuit is defect-free or not (for example, see Januz Rajki et al, "Embedded Deterministic Test for Low-Cost Manufacturing Test", Proceeding International Test Conference 2002 (ITC'02), 2002, p. 301-310 (U.S.A.)).

In recent years, moreover, an electrical system package which contains a plurality of semiconductor integrated circuits of different types, for example, a logic integrated circuit or a memory integrated circuit has often been used to enhance a mounting efficiency of an electronic apparatus. The semiconductor integrated circuits contained in the package are tested preceding the assembly and any of them which are decided to be a defect-free product is assembled in the package. However, a defect is also incorporated during the package assembly. Also after the package assembly, therefore, it is necessary to test the individual semiconductor integrated circuits.

At that time, it is possible to carry out a test through the compressed deterministic pattern test technique for a compressed deterministic pattern test compatible semiconductor integrated circuit. In the case in which a plurality of compressed deterministic pattern test compatible semiconductor integrated circuits is stored in the package, however, there is a need to modify access mechanism to the scan input/output terminals of the respective semiconductor integrated circuits from an outside.

For example, in some cases in which the scan input/output terminals of the compressed deterministic pattern test compatible semiconductor integrated circuits are simply pulled out as they are, a total number thereof exceeds the number of scan data inputting/outputting terminals of the LSI tester so that the test cannot be carried out at a time. On the other hand, in the case in which a terminal to be connected to the outside is shared with the semiconductor integrated circuits, a switching circuit is required for this purpose and there is a need to consider a place in the package where the switching circuit is to be provided.

In the case in which the compressed deterministic pattern test compatible semiconductor integrated circuit and a compressed deterministic pattern test non-compatible semiconductor integrated circuit are both reside in a package, moreover, the compressed deterministic pattern test non-compatible semiconductor integrated circuit is tested through a conventional scan test. Consequently, there is a possibility that a test time might be prolonged for only the semiconductor integrated circuit.

SUMMARY OF THE INVENTION

According to an aspect of the present invention, there is provided a package including: an external input portion; an external output portion; a plurality of integrated circuits that is compatible with a compressed deterministic pattern test, each of the integrated circuits including: an input portion; a decompressor that is connected to the input portion; scan chains that are connected to outputs of the decompressor; a compactor that is connected to outputs of the scan chains; a selector that is connected to the compactor and the input portion to selectively output an output of the compactor or an output of the input portion; and an output portion that is connected to the selector, wherein the integrated circuit are serially connected so that the output portion of the integrated circuit is connected to the input portion of the subsequent integrated circuit to form a sequential path, wherein the input portion of the integrated circuit configuring an initial stage of the sequential path is connected to the external input portion; and wherein the output portion of the integrated circuit configuring a final stage of the sequential path is connected to the external output portion.

According to another aspect of the present invention, there is provided a package including: an external input portion to which compressed test data is input; an external output portion configured to output compacted test result; a first integrated circuits that is compatible with a compressed deterministic pattern test, the first integrated circuits including: a first input portion that is connected to the external input portion to receive the compressed test data; a first decompressor that is connected to the first input portion to decompresses the compressed test data, and that outputs first test data; a first scan chain that is connected to the first decompressor to receive the first test data, and that outputs a first test result; a first compactor that is connected to the first scan chain to compact the first test result, and that outputs first compacted test result; a first selector that is connected to the first input portion and the first decompressor to selectively output the first test data or the compressed test data as a first selector output; a second selector that is connected to the first compactor and the first selector to selectively output the first compacted test result or the first selector output as a second selector output; and a first output portion that is connected to the second selector and that outputs the second selector output as a first circuit output, a second integrated circuits that is non-compatible with the compressed deterministic pattern test, the second integrated circuits including: a second input portion that is connected to the first output portion to receive the first circuit output; a second scan chain that is connected to the second input portion to receive the first test data, and that outputs a second test result; a third selector that is connected to the second scan chain and the second input portion to selectively output the second test result or the first circuit output as a third selector output; a second output portion that is connected to the third selector, and that outputs the third selector output as a second circuit output, a third integrated circuit that is compatible with the compressed deterministic pattern test, the third integrated circuits including: a third input portion that is connected to the second output portion to receive the second circuit output; a third decompressor that is connected to the third input portion to decompress the compressed test data, and that outputs third test data; a third scan chain that is connected to the third decompressor to receive the third test data, and that outputs a third test result; a forth selector that is connected to the third scan chain and the third input portion to selectively output the second test result or the third test result as a forth selector output; a third compactor that is connected to the forth selector to compress the fourth selector output, and that outputs a third compacted test result; a fifth selector that is connected to the third compactor and the third input portion to selectively output the first compacted test result or the third compacted test result as a fifth selector output; and a third output portion that is connected to the fifth selector, and that outputs the fifth selector output to the external output portion as the compacted test result.

According to another aspect of the present invention, there is provided a package including: an external input portion; an external output portion; a first integrated circuit that is compatible with a compressed deterministic pattern test, the integrated circuit including: an input portion; a first decompressor that is connected to the input portion; a first scan chain that is connected to the decompressor; a compactor that is connected to the scan chain; and an output portion that is connected to the selector, a second integrated circuit that is non-compatible with the compressed deterministic pattern test, the second integrated circuit including a scan chain that is configured to be connected to the first decompressor and the first compactor.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION OF THE PREFERRED EMBODIMENTS

An embodiment according to the invention will be described below with reference to the drawings.

First Embodiment

Figure 1:
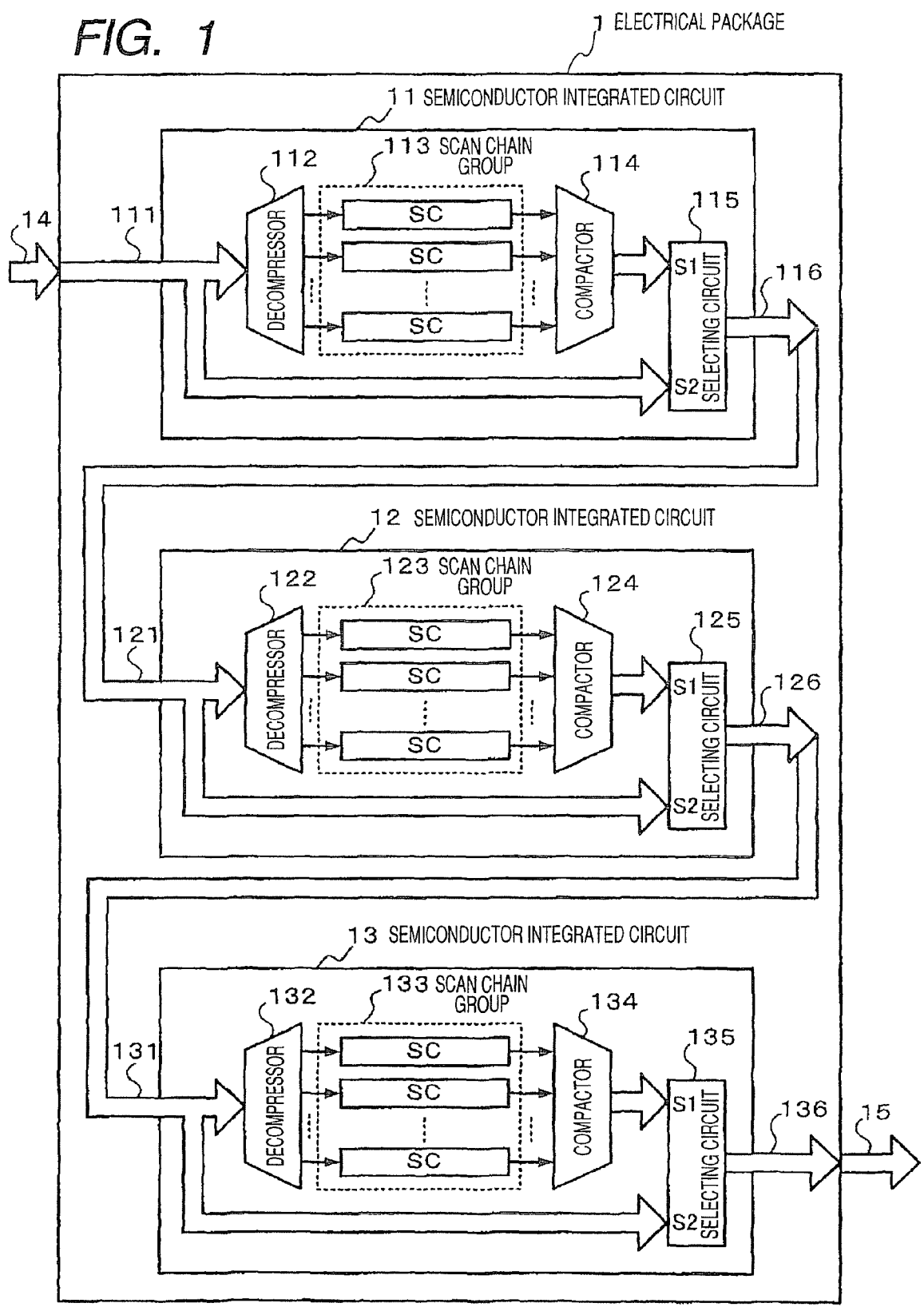
FIG. 1 is an exemplary block diagram showing an embodiment of a structure of a package according to a first embodiment of the invention.

FIG. 1 is a block diagram showing an embodiment of a structure of an electrical package according to a first embodiment of the invention.

A package 1 mounts semiconductor integrated circuits 11, 12 and 13 which are compressed deterministic pattern test compatible semiconductor integrated circuits, and comprises an external scan input terminal 14 and an external scan output terminal 15.

The semiconductor integrated circuit 11 includes a scan input terminal 111, an decompressor 112 for a compressed deterministic pattern test which is connected to the scan input terminal 111, a scan chain group 113 having a plurality of scan chains (SCs) to which outputs of the decompressor 112 are loaded respectively, a compactor 114 for a compressed deterministic pattern test to which the scan outputs of the scan chain group 113 are unloaded, a selecting circuit 115 for outputting a signal input to the scan input terminal 111 in place of an output of the compactor 114, and a scan output terminal 116 for inputting the output of the selecting circuit 115.

Similarly, the semiconductor integrated circuit 12 includes a scan input terminal 121, an decompressor 122, a scan chain group 123, a compactor 124, a selecting circuit 125 and a scan output terminal 126, and the semiconductor integrated circuit 13 includes a scan input terminal 131, an decompressor 132, a scan chain group 133, a compactor 134, a selecting circuit 135, and a scan output terminal 136.

In the case in which the selecting circuits 115, 125 and 135 select the scan input terminal 111, 121 and 131 sides, a combinational circuit is formed between the respective scan input/output terminals of the semiconductor integrated circuits 11, 12 and 13 and it is supposed that the test can be executed only at a low speed due to a delay thereof. In that case, one to several registers are inserted in the middle of the combinational circuit to distribute a delay time.

The scan output terminal 116 of the semiconductor integrated circuit 11 is connected to the scan input terminal 121 of the semiconductor integrated circuit 12 and the scan output terminal 126 of the semiconductor integrated circuit 12 is connected to the scan input terminal 131 of the semiconductor integrated circuit 13 so that a scan test path is formed between the scan input/output terminals of the semiconductor integrated circuits 11, 12 and 13.

In the semiconductor integrated circuits 11, 12 and 13 which connect the scan output terminals in the former stages to the scan input terminals in the subsequent stages to form the scan test path, thus, the scan input terminal 111 of the semiconductor integrated circuit 11 corresponding to an initial stage is connected to the external scan input terminal 14 and the scan output terminal 136 of the semiconductor integrated circuit 13 corresponding to a final stage is connected to the external scan output terminal 15.

In the package 1 according to the embodiment, input destinations of the selecting circuits 115, 125 and 135 included in the semiconductor integrated circuits 11, 12 and 13 are switched to form the scan test path for carrying out a scan test of the semiconductor integrated circuit 11, 12 and 13 units. Consequently, a compressed deterministic pattern test for the semiconductor integrated circuits 11, 12 and 13 becomes possible to be individually carried out. It is assumed that the input destinations of the selecting circuits 115, 125 and 135 are switched in response to a test mode signal (not shown) which is input thereto.

The formation of the scan test path for individually carrying out the compressed deterministic pattern test for the semiconductor integrated circuits 11, 12 and 13 will be described with reference to FIGS. 2 to 4.

Figure 2:
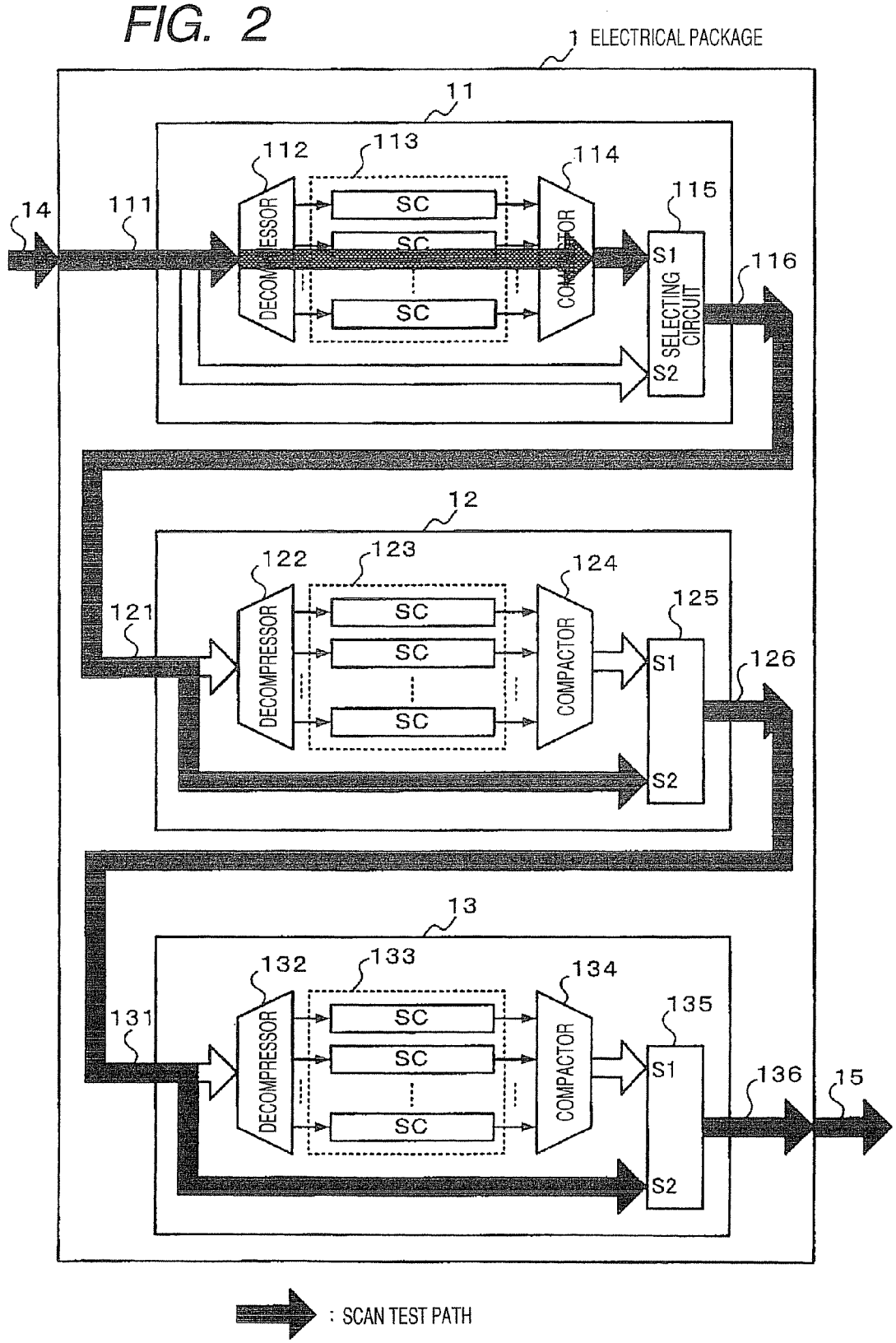
FIG. 2 is an exemplary diagram for explaining a scan test path in a scan test of the package shown in FIG. 1.

FIG. 2 is a diagram showing a state of the formation of the scan test path for executing the compressed deterministic pattern test of the semiconductor integrated circuit 11. The scan test path which is formed is shown in a color.

When the compressed deterministic pattern test for the semiconductor integrated circuit 11 is to be executed, the selecting circuit 115 of the semiconductor integrated circuit 11 selects an output (an S1 input side) of the compactor 114, the selecting circuit 125 of the semiconductor integrated circuit 12 selects a signal (an S2 input side) to be input to the scan input terminal 121, and the selecting circuit 135 of the semiconductor integrated circuit 13 selects a signal (an S2 input side) to be input to the scan input terminal 131.

Thus, the input destinations of the selecting circuits 115, 125 and 135 are switched to execute the compressed deterministic pattern test for the semiconductor integrated circuit 11.

When compressed test data for the compressed deterministic pattern test of the semiconductor integrated circuit 11 are loaded via the external scan input terminal 14 of the package 1, they are input to the decompressor 112 through the scan input terminal 111 of the semiconductor integrated circuit 11 and are decompressed through the decompressor 112 so that a scan test pattern is distributed to each of the scan chains (SCs) of the scan chain group 113. When the scan test is executed through each of the scan chains, a result of the execution is compressed through the compactor 114. The data thus compressed are unloaded to the scan output terminal 116 through the selecting circuit 115.

The compression data output to the scan output terminal 116 are transmitted in a path of the scan input terminal 121 of the semiconductor integrated circuit 12, the selecting circuit 125, the scan output terminal 126, the scan input terminal 131 of the semiconductor integrated circuit 13, the selecting circuit 135 and the scan output terminal 136, and are then output to the external scan output terminal 15 of the package 1.

By using the external scan input terminal 14 and the external scan output terminal 15 in the package 1, thus, the compressed deterministic pattern test for the semiconductor integrated circuit 11 unit is executed.

Next, description will be given to the execution of the compressed deterministic pattern test for the semiconductor integrated circuit 12 unit.

Figure 3:
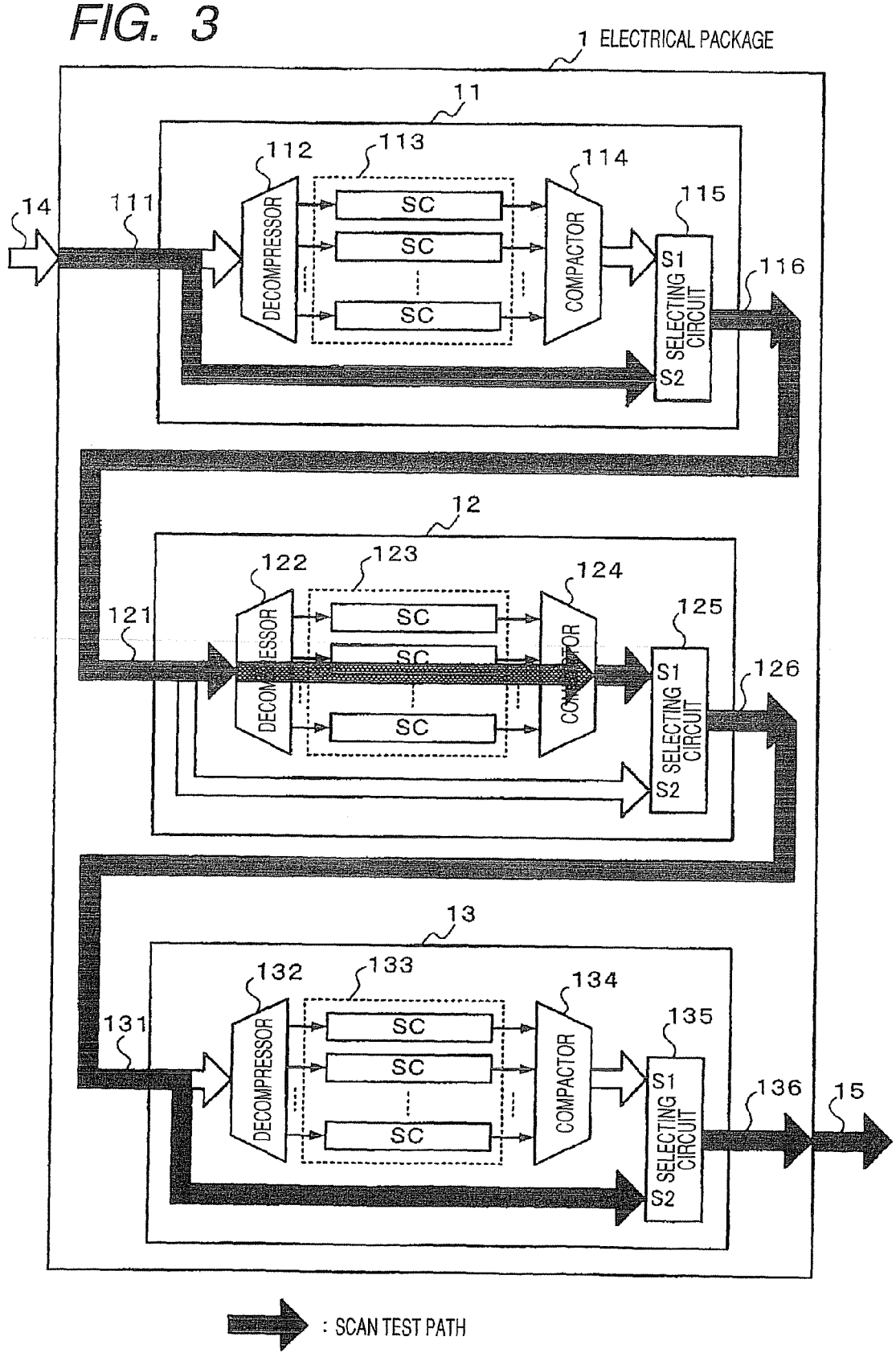
FIG. 3 is an exemplary diagram for explaining the scan test path in the scan test of the package shown in FIG. 1.

FIG. 3 is a diagram showing a state of the formation of the scan test path for executing the compressed deterministic pattern test of the semiconductor integrated circuit 12. Similarly, the scan test path which is formed is shown in a color.

When the compressed deterministic pattern test for the semiconductor integrated circuit 12 is to be executed, the selecting circuit 115 of the semiconductor integrated circuit 11 selects a signal (an S2 input side) to be input to the scan input terminal 111, the selecting circuit 125 of the semiconductor integrated circuit 12 selects an output (an S1 input side) of the compactor 124, and the selecting circuit 135 of the semiconductor integrated circuit 13 selects the signal (the S2 input side) to be input to the scan input terminal 131.

Thus, the input destinations of the selecting circuits 115, 125 and 135 are switched to execute the compressed deterministic pattern test for the semiconductor integrated circuit 12.

When compressed test data for the compressed deterministic pattern test of the semiconductor integrated circuit 12 are loaded via the external scan input terminal 14 of the package 1, they are input to the decompressor 122 through a path of the scan input terminal 111 of the semiconductor integrated circuit 11, the selecting circuit 115 and the scan output terminal 116 and are then input to the decompressor 122 through the scan input terminal 121 of the semiconductor integrated circuit 12.

The compressed deterministic pattern test data thus input are decompressed through the decompressor 122 so that a scan test pattern is distributed to each of the scan chains (SCs) of the scan chain group 123. When the scan test is executed through each of the scan chains, a result of the execution is compressed through the compactor 124. The data thus compressed are unloaded to the scan output terminal 126 through the selecting circuit 125.

The compression data output to the scan output terminal 126 are transmitted in a path of the scan input terminal 131 of the semiconductor integrated circuit 13, the selecting circuit 135 and the scan output terminal 136 and are then output to the external scan output terminal 15 of the package 1.

By using the external scan input terminal 14 and the external scan output terminal 15 in the package 1, thus, the compressed deterministic pattern test for the semiconductor integrated circuit 12 unit is executed.

Next, description will be given to the execution of the compressed deterministic pattern test for the semiconductor integrated circuit 13 unit.

Figure 4:
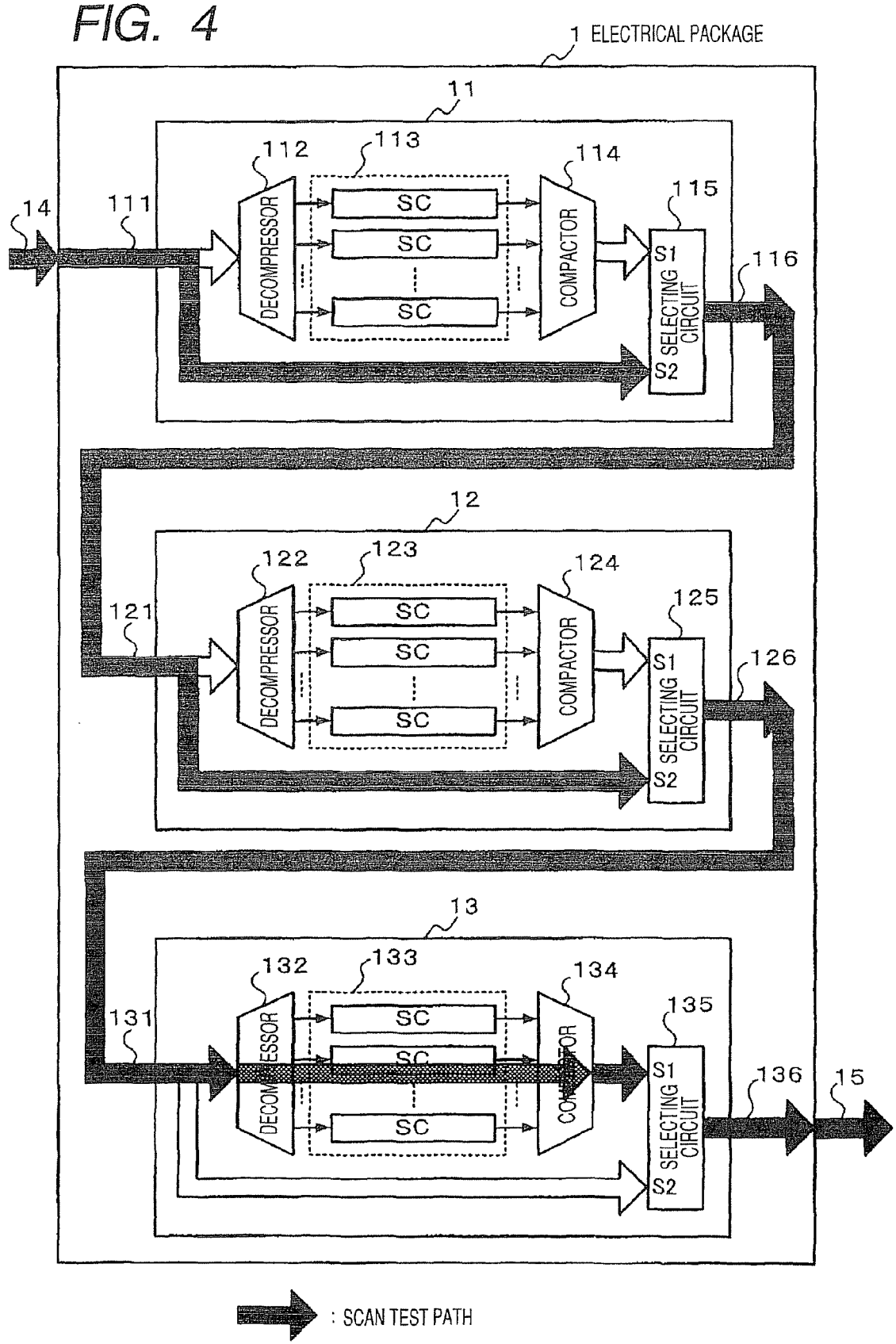
FIG. 4 is an exemplary diagram for explaining the scan test path in the scan test of the package shown in FIG. 1.

FIG. 4 is a diagram showing a state of the formation of the scan test path for executing the compressed deterministic pattern test of the semiconductor integrated circuit 13. Similarly, the scan test path which is formed is shown in a color.

When the compressed deterministic pattern test for the semiconductor integrated circuit 12 is to be executed, the selecting circuit 115 of the semiconductor integrated circuit 11 selects a signal (an S2 input side) to be input to the scan input terminal 111, the selecting circuit 125 of the semiconductor integrated circuit 12 selects the signal (the S2 input side) to be input to the scan input terminal 121, and the selecting circuit 135 of the semiconductor integrated circuit 13 selects an output (an S1 input side) of the compactor 134.

Thus, the input destinations of the selecting circuits 115, 125 and 135 are switched to execute the compressed deterministic pattern test for the semiconductor integrated circuit 13.

When compressed test data for the compressed deterministic pattern test of the semiconductor integrated circuit 13 are loaded via the external scan input terminal 14 of the package 1, they are transmitted in a path of the scan input terminal 111 of the semiconductor integrated circuit 11, the selecting circuit 115, the scan output terminal 116, the scan input terminal 121 of the semiconductor integrated circuit 12, the selecting circuit 125, and the scan output terminal 126 and are input to the decompressor 132 through the scan input terminal 131 of the semiconductor integrated circuit 13.

The compressed test data thus input are decompressed through the decompressor 132 so that a scan test pattern is distributed to each of the scan chains (SCs) of the scan chain group 133. When the scan test is executed through each of the scan chains, a result of the execution is compressed through the compactor 134. The data thus compressed are unloaded to the scan output terminal 136 through the selecting circuit 135 and are exactly output to the external scan output terminal 15 of the package 1.

By using the external scan input terminal 14 and the external scan output terminal 15 in the package 1, thus, the compressed deterministic pattern test for the semiconductor integrated circuit 13 unit is executed.

According to the embodiment, similarly, the package mounting a plurality of compressed deterministic pattern test compatible semiconductor integrated circuits can individually execute the compressed deterministic pattern test for the respective semiconductor integrated circuits by simply preparing a set of external scan input/output terminals. Consequently, it is not necessary to provide the external scan input/output terminals for the individual semiconductor integrated circuits respectively. Thus, it is possible to prevent an increase in the number of pins in the package.

Figure 12:
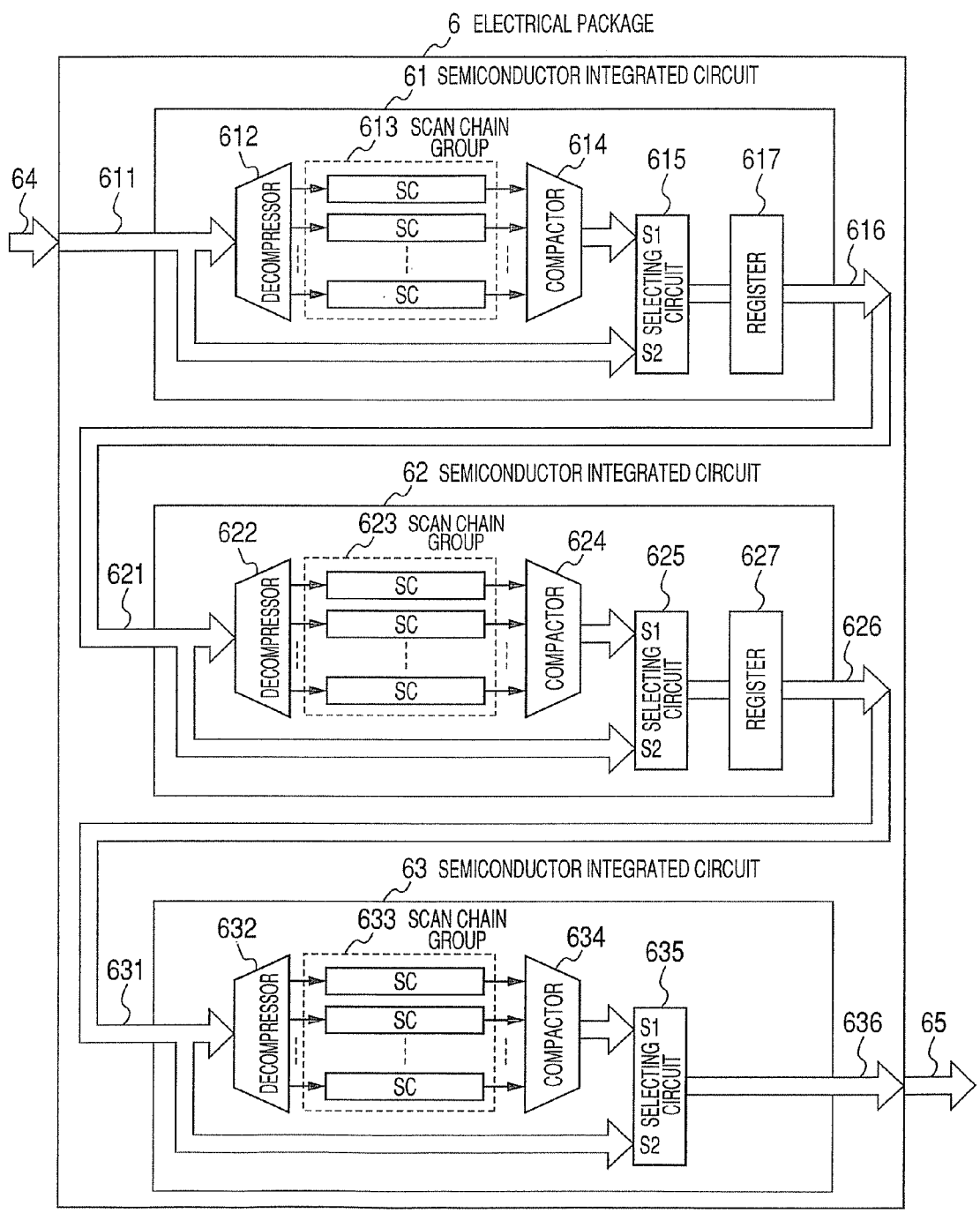
FIG. 12 is an exemplary block diagram showing a variant of a structure of a package according to the first embodiment of the invention.

As shown in FIG. 12, a register may be included in the semiconductor integrated circuits suitably to absorb a delay of an output of the semiconductor integrated circuits.

Second Embodiment

In an electrical package according to the embodiment, a compressed deterministic pattern test compatible semiconductor integrated circuit and a compressed deterministic pattern test non-compatible semiconductor integrated circuit reside in a package.

Figure 5:
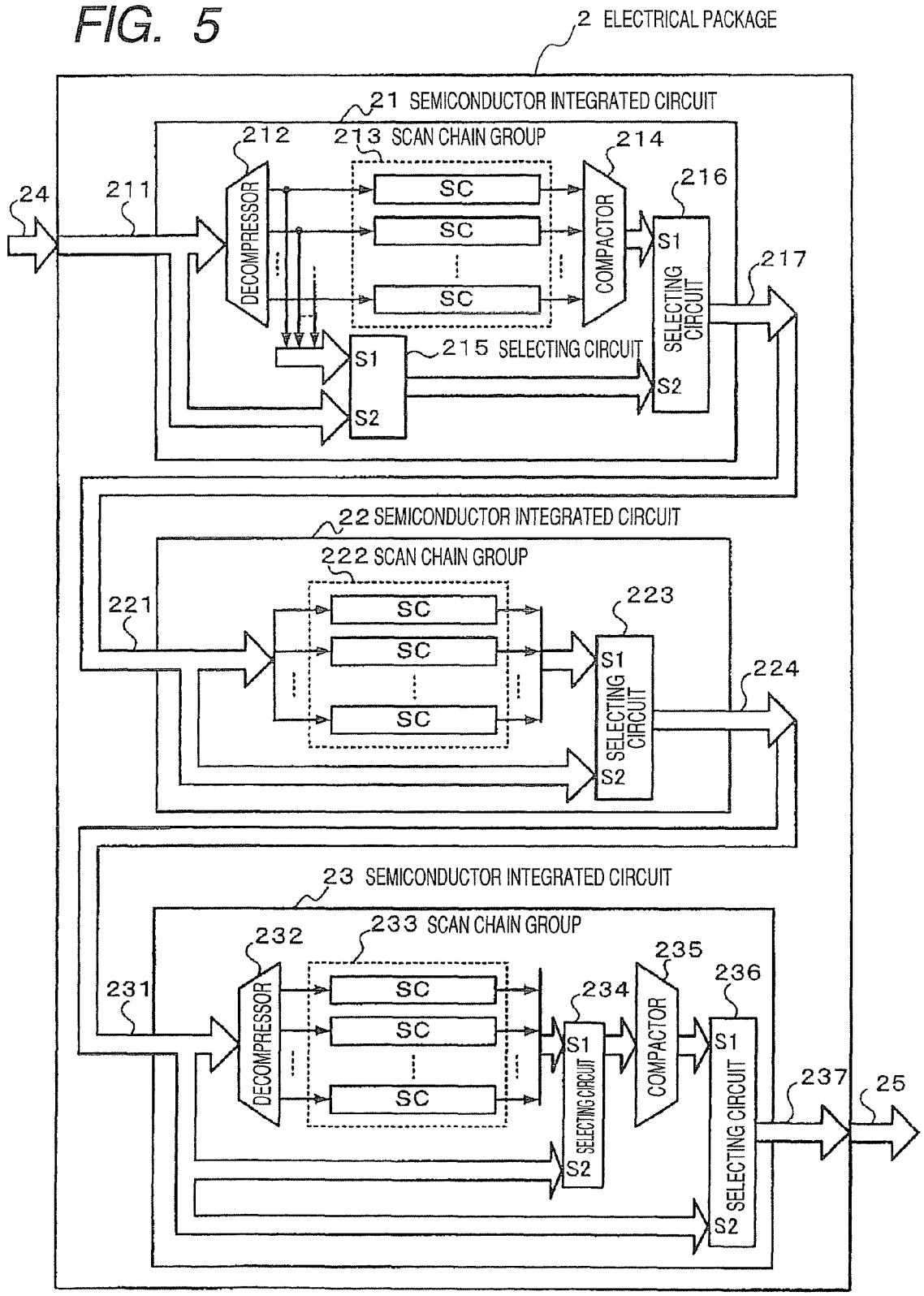
FIG. 5 is an exemplary block diagram showing an embodiment of a structure of a package according to a second embodiment of the invention.

FIG. 5 is a block diagram showing an embodiment of a structure of the electrical package according to the second embodiment of the invention.

A package 2 mounts compressed deterministic pattern test compatible semiconductor integrated circuits 21 and 23 and a compressed deterministic pattern test non-compatible semiconductor integrated circuit 22, and comprises an external scan input terminal 24 and an external scan output terminal 25.

The semiconductor integrated circuit 21 includes a scan input terminal 211, an decompressor 212 for a compressed deterministic pattern test which is connected to the scan input terminal 211, a scan chain group 213 having a plurality of scan chains (SCs) to which outputs of the decompressor 212 are loaded respectively, a compactor 214 for a compressed deterministic pattern test to which the scan outputs from the scan chain group 213 are input, a selecting circuit 215 for selecting and outputting either a part of outputs or an input of the decompressor 212, a selecting circuit 216 for outputting an output of the selecting circuit 215 in place of an output of the compactor 214, and a scan output terminal 217 for inputting the output of the selecting circuit 216.

The semiconductor integrated circuit 22 includes a scan input terminal 221, a scan chain group 222 having a plurality of scan chains (SCs) to which scan data are loaded from the scan input terminal 221, a selecting circuit 223 for outputting data to be input to the scan input terminal 221 in place of scan output data transmitted from the scan chain group 222, and a scan output terminal 224 for inputting the output of the selecting circuit 223.

The selecting circuit 223 can also be omitted. In that case, the data input to the scan input terminal 221 are scanned and shifted in the scan chains (SCs) and are then transmitted to the scan output terminal 224.

The semiconductor integrated circuit 23 includes a scan input terminal 231, an decompressor 232 for a compressed deterministic pattern test which is connected to the scan input terminal 231, a scan chain group 233 having a plurality of scan chains (SCs) to which outputs of the decompressor 232 are loaded respectively, a selecting circuit 234 for outputting data to be input to the scan input terminal 231 in place of a part of the scan output data transmitted from the scan chain group 233, a compactor 235 for a compressed deterministic pattern test to which the output of the selecting circuit 234 is input, a selecting circuit 236 for outputting data to be input to the scan input terminal 231 in place of an output of the compactor 235, and a scan output terminal 237 for inputting the output of the selecting circuit 236.

The scan output terminal 217 of the semiconductor integrated circuit 21 is connected to the scan input terminal 221 of the semiconductor integrated circuit 22 and the scan output terminal 224 of the semiconductor integrated circuit 22 is connected to the scan input terminal 231 of the semiconductor integrated circuit 23 so that a scan test path is formed between the scan input/output terminals of the semiconductor integrated circuits 21, 22 and 23.

In the semiconductor integrated circuits 21, 22 and 23 in which the scan output terminal in a former stage is connected to the scan input terminal in a subsequent stage to form a scan test path, thus, the scan input terminal 211 of the semiconductor integrated circuit 21 to be one of compressed deterministic pattern test compatible semiconductor integrated circuits is connected to the external scan input terminal 24 and the scan output terminal 237 of the semiconductor integrated circuit 23 to be another compressed deterministic pattern test compatible semiconductor integrated circuit is connected to the external scan output terminal 25.

In the package 2 according to the embodiment, input destinations of the selecting circuits 215, 216, 223, 234 and 236 included in the semiconductor integrated circuits 21, 22 and 23 are switched to form the scan test path for carrying out a scan test of the semiconductor integrated circuit 21, 22 and 23 units. Consequently, a compressed deterministic pattern test for the semiconductor integrated circuits 21, 22 and 23 can be individually carried out including the originally compressed deterministic pattern test non-compatible semiconductor integrated circuit 22. It is assumed that the input destinations of the selecting circuits 215, 216, 223, 234 and 236 can be switched in response to a test mode signal (not shown) which is input thereto.

The formation of the scan test path for individually carrying out the compressed deterministic pattern test for the semiconductor integrated circuits 21, 22 and 23 will be described with reference to FIGS. 6 to 8.

Figure 6:
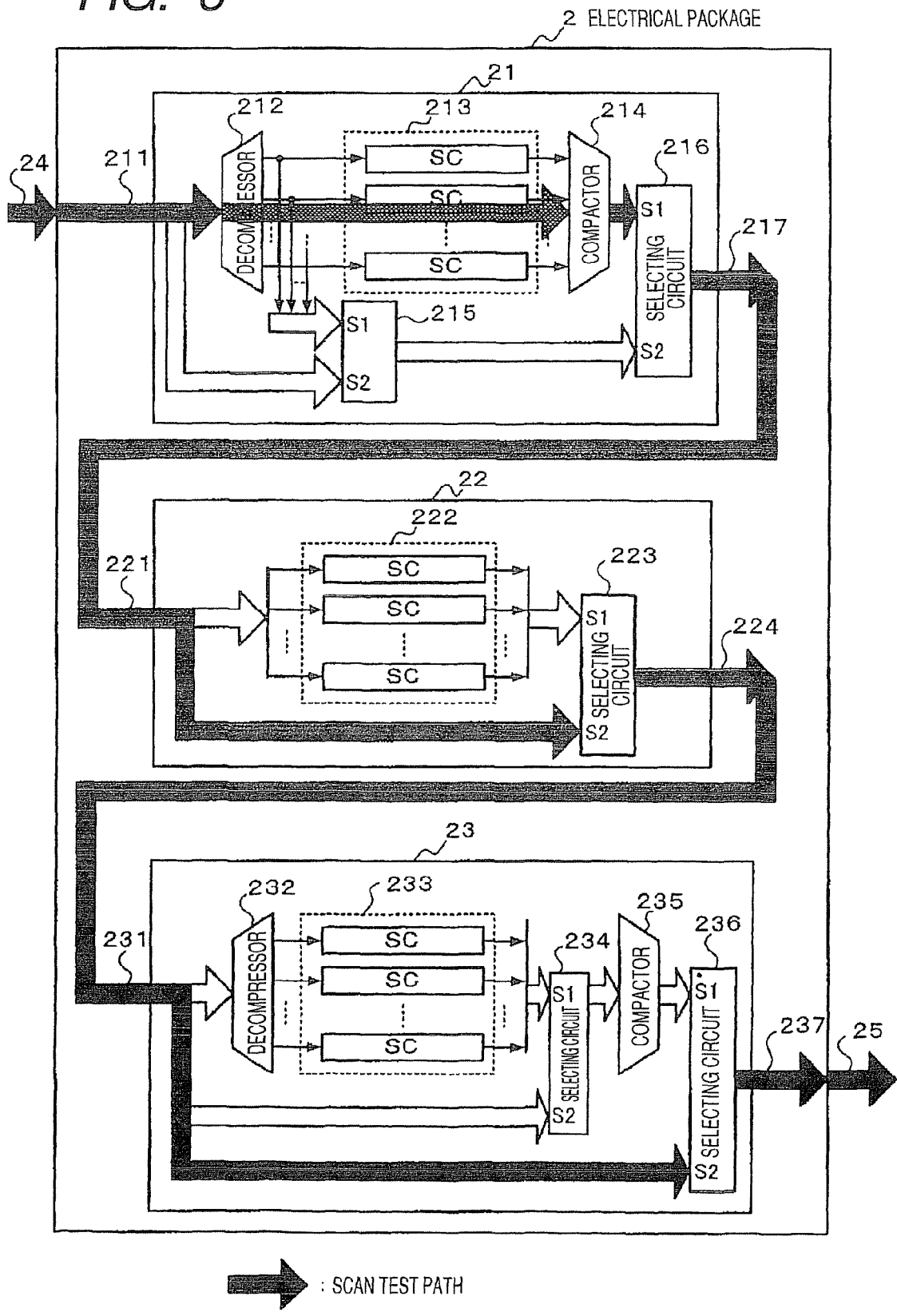
FIG. 6 is an exemplary diagram for explaining a scan test path in a scan test of the package shown in FIG. 5.

FIG. 6 is a diagram showing a state of the formation of the scan test path for executing the compressed deterministic pattern test of the semiconductor integrated circuit 21. The scan test path which is formed is shown in a color.

When the compressed deterministic pattern test for the semiconductor integrated circuit 21 is to be executed, the selecting circuit 216 of the semiconductor integrated circuit 21 selects an output (an S1 input side) of the compactor 214, the selecting circuit 223 of the semiconductor integrated circuit 22 selects a signal (an S2 input side) to be input to the scan input terminal 221, and the selecting circuit 236 of the semiconductor integrated circuit 23 selects a signal (an S2 input side) to be input to the scan input terminal 231. Since the selecting circuit 215 of the semiconductor integrated circuit 21 and the selecting circuit 234 of the semiconductor integrated circuit 23 are not related to the test, it is not necessary to take the selection of the input into consideration.

Thus, the input destinations of the selecting circuits 216, 223 and 236 are switched to execute the compressed deterministic pattern test for the semiconductor integrated circuit 21.

When compressed test data for the compressed deterministic pattern test of the semiconductor integrated circuit 21 are loaded via the external scan input terminal 24 of the package 2, they are input to the decompressor 212 through the scan input terminal 211 of the semiconductor integrated circuit 21 and are decompressed through the decompressor 212 so that a scan test pattern is distributed to each of the scan chains (SCs) of the scan chain group 213. When the scan test is executed through each of the scan chains, a result of the execution is compressed through the compactor 214. The data thus compressed are unloaded to the scan output terminal 217 through the selecting circuit 216.

The compression data output to the scan output terminal 217 are transmitted in a path of the scan input terminal 221 of the semiconductor integrated circuit 22, the selecting circuit 223, the scan output terminal 224, the scan input terminal 231 of the semiconductor integrated circuit 23, the selecting circuit 236 and the scan output terminal 237, and are then output to the external scan output terminal 25 of the package 2.

By using the external scan input terminal 24 and the external scan output terminal 25 in the package 2, thus, the compressed deterministic pattern test for the semiconductor integrated circuit 21 unit is executed.

Next, description will be given to the execution of the compressed deterministic pattern test for the semiconductor integrated circuit 22 unit.

Figure 7:
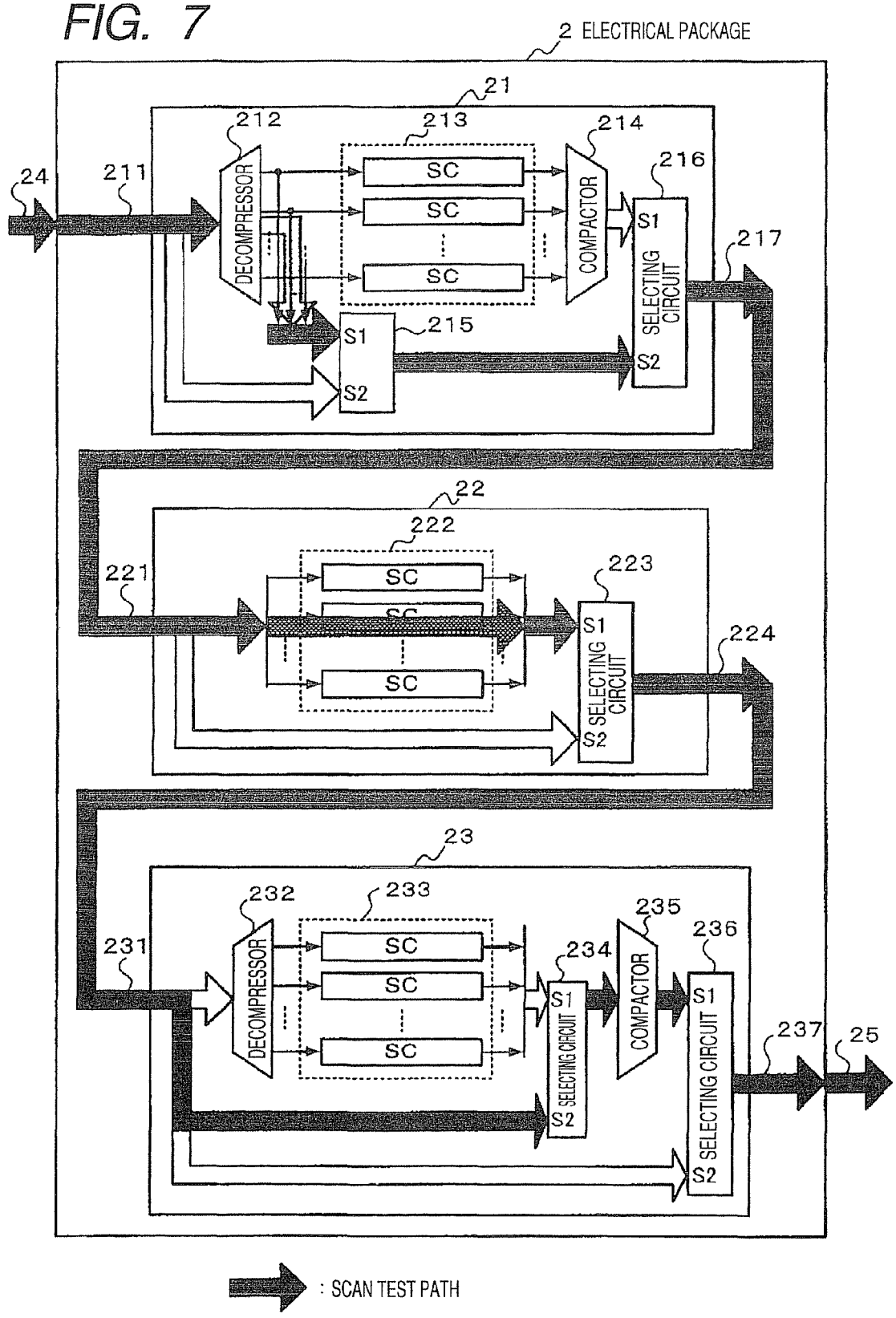
FIG. 7 is an exemplary diagram for explaining the scan test path in the scan test of the package shown in FIG. 5.

FIG. 7 is a diagram showing a state of the formation of the scan test path for executing the compressed deterministic pattern test of the semiconductor integrated circuit 22. Similarly, the scan test path which is formed is shown in a color.

When the compressed deterministic pattern test for the semiconductor integrated circuit 22 is to be executed, the selecting circuit 215 of the semiconductor integrated circuit 21 selects a part of outputs (an S1 input side) of the decompressor 212, the selecting circuit 216 selects an output (an S2 input side) of the selecting circuit 215, the selecting circuit 223 of the semiconductor integrated circuit 22 selects an output (an S1 input side) from the scan chain group 222, the selecting circuit 234 of the semiconductor integrated circuit 23 selects a signal (an S2 input side) to be input to the scan input terminal 231, and the selecting circuit 236 selects an output (an S1 input side) of the compactor 235.

Thus, the input destinations of the selecting circuits 215, 216, 223, 234 and 236 are switched to execute the compressed deterministic pattern test for the semiconductor integrated circuit 22. At this time, the number of the outputs of the decompressor 212 which are input to the selecting circuit 215 of the semiconductor integrated circuit 21 corresponds to the number of the scan chains (SCs) included in the scan chain group 222 of the semiconductor integrated circuit 22.

When the compressed test data for the compressed deterministic pattern test of the semiconductor integrated circuit 22 are loaded to the external scan input terminal 24 of the package 2, they are input to the decompressor 212 through the scan input terminal 211 of the semiconductor integrated circuit 21. Upon receipt of the input, the decompressor 212 generates scan test data to be distributed to each of the scan chains (SCs) of the scan chain group 222 of the semiconductor integrated circuit 22.

The scan test data thus generated are transmitted in a path of the selecting circuit 215, the selecting circuit 216 and the scan output terminal 217, and are distributed to each of the scan chains (SCs) of the scan chain group 222 through the scan input terminal 221 of the semiconductor integrated circuit 22. In each of the scan chains (SCs) of the scan chain group 222, a scan test is executed based on the scan test data which are distributed.

A result of the execution is unloaded to the scan output terminal 224 through the selecting circuit 223.

The result of the scan test execution which is output to the scan output terminal 224 is transmitted in a path of the scan input terminal 231 and the selecting circuit 234 in the semiconductor integrated circuit 23, and is input to the compactor 235 and is compressed through the compactor 235.

The data thus compressed are transmitted in a path of the selecting circuit 236 and the scan output terminal 237 and are then output to the external scan output terminal 25 of the package 2.

By using the external scan input terminal 24 and the external scan output terminal 25 in the package 2, thus, the compressed deterministic pattern test for the originally compressed deterministic pattern test non-compatible semiconductor integrated circuit 22 unit is executed.

Next, description will be given to the execution of the compressed deterministic pattern test for the semiconductor integrated circuit 23 unit.

Figure 8:
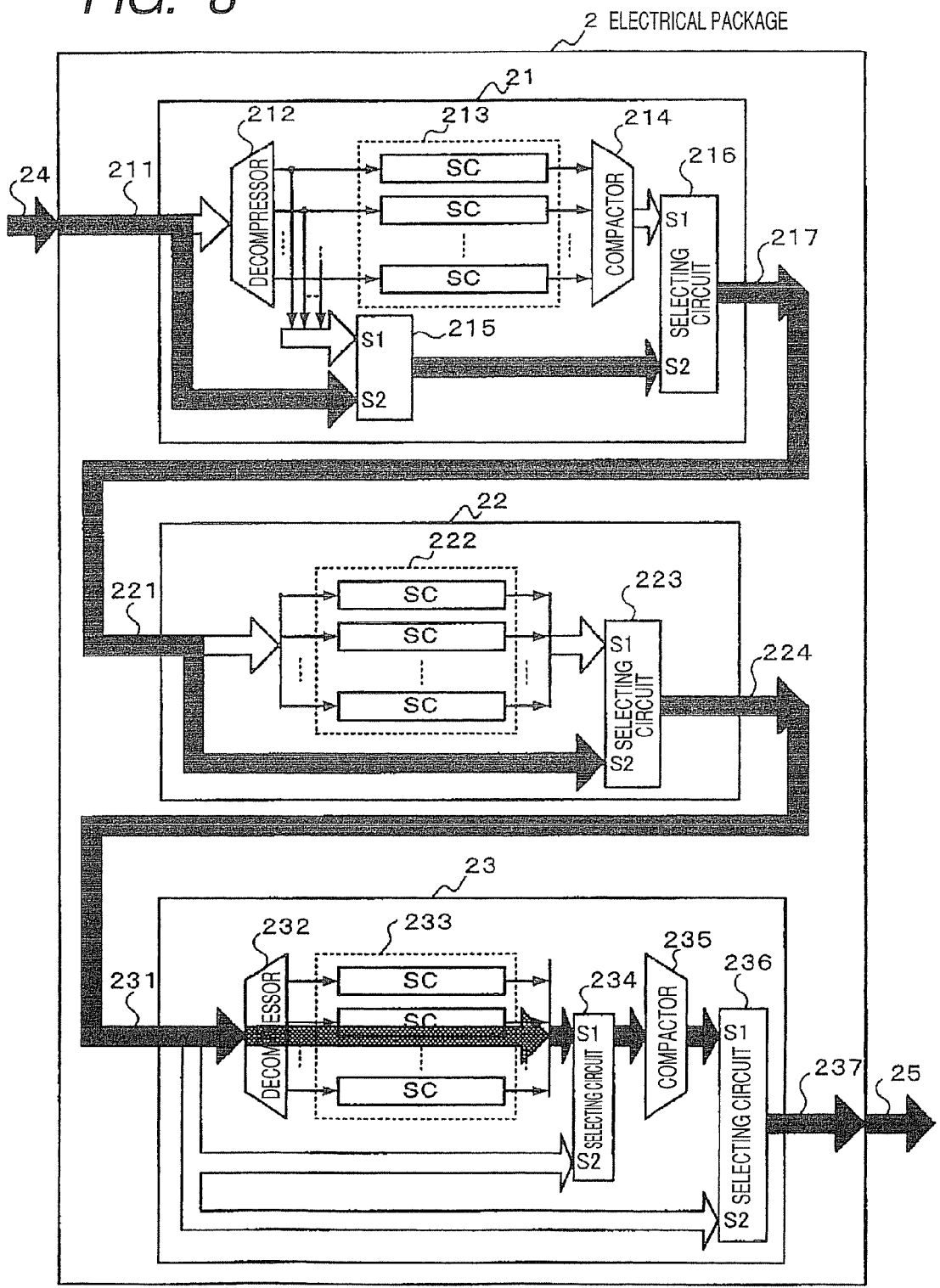
FIG. 8 is an exemplary diagram for explaining the scan test path in the scan test of the package shown in FIG. 5.

FIG. 8 is a diagram showing a state of the formation of the scan test path for executing the compressed deterministic pattern test of the semiconductor integrated circuit 23. Similarly, the scan test path which is formed is shown in a color.

When the compressed deterministic pattern test for the semiconductor integrated circuit 23 is to be executed, the selecting circuit 215 of the semiconductor integrated circuit 21 selects the scan input terminal 211 (the S2 input side), the selecting circuit 216 selects the output (the S2 input side) of the selecting circuit 215, the selecting circuit 223 of the semiconductor integrated circuit 22 selects the input signal to the scan input terminal 221 (the S2 input side), the selecting circuit 234 of the semiconductor integrated circuit 23 selects the output (the S1 input side) from the scan chain group 233, and the selecting circuit 236 selects the output (the S1 input side) of the compactor 235.

Thus, the input destinations of the selecting circuits 215, 216, 223, 234 and 236 are switched to execute the compressed deterministic pattern test for the semiconductor integrated circuit 21.

When compressed test data for the compressed deterministic pattern test of the semiconductor integrated circuit 21 are loaded to the external scan input terminal 24 of the package 2, they are transmitted in a path of the scan input terminal 211 of the semiconductor integrated circuit 21, the selecting circuit 215, the selecting circuit 216, the scan output terminal 217, the scan input terminal 221 of the semiconductor integrated circuit 22, the selecting circuit 223 and the scan output terminal 224, and are then input to the decompressor 232 through the scan input terminal 231 of the semiconductor integrated circuit 23.

The compressed test data thus input are decompressed through the decompressor 232 so that a scan test pattern is distributed to each of the scan chains (SCs) of the scan chain group 233. When the scan test is executed through each of the scan chains, a result of the execution is input to the compactor 235 through the selecting circuit 234 and is compressed through the compactor 235. The data thus compressed are unloaded to the scan output terminal 237 through the selecting circuit 236 and are then output to the external scan output terminal 25 of the package 2 as they are.

By using the external scan input terminal 24 and the external scan output terminal 25 in the package 2, thus, the compressed deterministic pattern test for the semiconductor integrated circuit 23 unit is executed.

According to the embodiment, it is possible to execute a scan test through a compressed deterministic pattern test technique for a semiconductor integrated circuit having neither the decompressor nor the compactor which are assembled in the package in addition to the compressed deterministic pattern test compatible semiconductor integrated circuit. Consequently, it is possible to reduce a test time and a test data volume for the package.

In this case, according to the embodiment, the compressed deterministic pattern test compatible semiconductor integrated circuit transmits the scan test data to the compressed deterministic pattern test non-compatible semiconductor integrated circuit through the scan output terminal and receives the scan test result of the compressed deterministic pattern test non-compatible semiconductor integrated circuit through the scan input terminal. In the embodiment, therefore, a new terminal for an interface with the compressed deterministic pattern test non-compatible semiconductor integrated circuit does not need to be provided in the compressed deterministic pattern test compatible semiconductor integrated circuit. Thus, it is possible to prevent an increase in the number of the terminals of the compressed deterministic pattern test compatible semiconductor integrated circuit.

Third Embodiment

In the first and second embodiments, it is possible to execute the scan test through the compression scan technique for each of the semiconductor integrated circuits mounted on the package by providing the selecting circuit in the compressed deterministic pattern test compatible semiconductor integrated circuit. In each of the embodiments, an arranging position of the selecting circuit to be provided in the compressed deterministic pattern test compatible semiconductor integrated circuit is varied depending on whether the compressed deterministic pattern test non-compatible semiconductor integrate circuit resides in the same package or a position in the scan test path where the compressed deterministic pattern test compatible semiconductor integrated circuit is to be disposed. More specifically, it is necessary to change an internal structure of the compressed deterministic pattern test compatible semiconductor integrated circuit depending on a situation of the semiconductor integrated circuit mounted on the package.

In the embodiment, therefore, description will be given to a structure of a compressed deterministic pattern test compatible semiconductor integrated circuit which can be used in common irrespective of the situation of the semiconductor integrated circuit assembled in the package.

Figure 9:
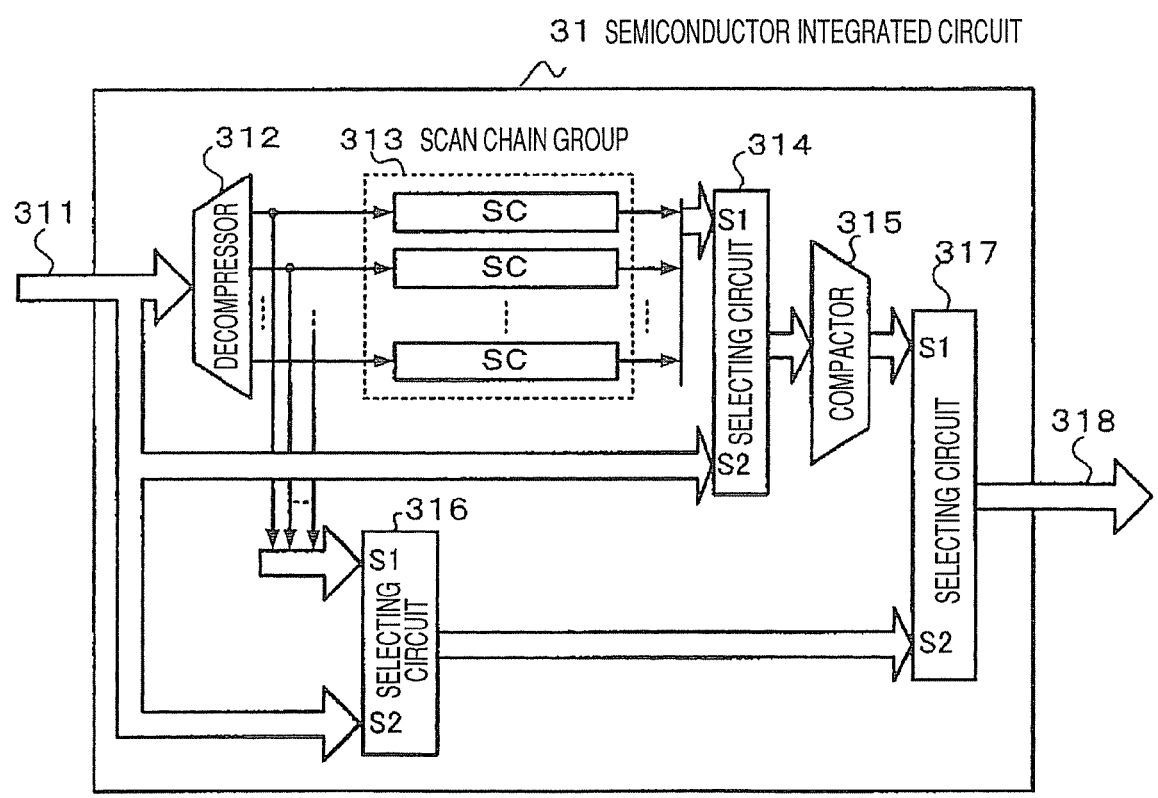
FIG. 9 is an exemplary block diagram showing an embodiment of a structure of a semiconductor integrated circuit according to a third embodiment of the invention.

FIG. 9 is a block diagram showing an embodiment of the structure of the semiconductor integrated circuit according to the embodiment.

A semiconductor integrated circuit 31 according to the embodiment comprises a scan input terminal 311, an decompressor 312, a scan chain group 313, a compactor 315 and a scan output terminal 318, and furthermore, a selecting circuit 314 for inputting, to the compactor 315, an input to the decompressor 312 in place of outputs from the scan chain group 313, a selecting circuit 316 for selecting and outputting either the input or a part of outputs of the decompressor 312, and a selecting circuit 317 for outputting the output of the selecting circuit 316 to the scan output terminal 318 in place of an output of the compactor 315.

The selecting circuit 314 corresponds to the selecting circuit 234 of the semiconductor integrated circuit 23 according to the second embodiment and the selecting circuit 316 corresponds to the selecting circuit 215 of the semiconductor integrated circuit 21 according to the second embodiment. Moreover, the selecting circuit 317 corresponds to the selecting circuit 216 of the semiconductor integrated circuit 21 and the selecting circuit 236 of the semiconductor integrated circuit 23 according to the second embodiment.

Moreover, the selecting circuit 317 corresponds to the selecting circuits 115, 125 and 135 of the semiconductor integrated circuits 11, 12 and 13 according to the first embodiment.

Accordingly, the semiconductor integrated circuit 31 according to the embodiment can be replaced with the semiconductor integrated circuits 11, 12 and 13 according to the first embodiment and can be replaced with the semiconductor integrated circuit 21 and the semiconductor integrated circuit 23 according to the second embodiment.

According to the embodiment, it is possible to use a compressed deterministic pattern test compatible semiconductor integrated circuit having an identical internal structure in common irrespective of the situation of the semiconductor integrated circuit to be mounted on the package. Consequently, it is possible to easily design the compressed deterministic pattern test compatible semiconductor integrated circuit.

Fourth Embodiment

Figure 10:
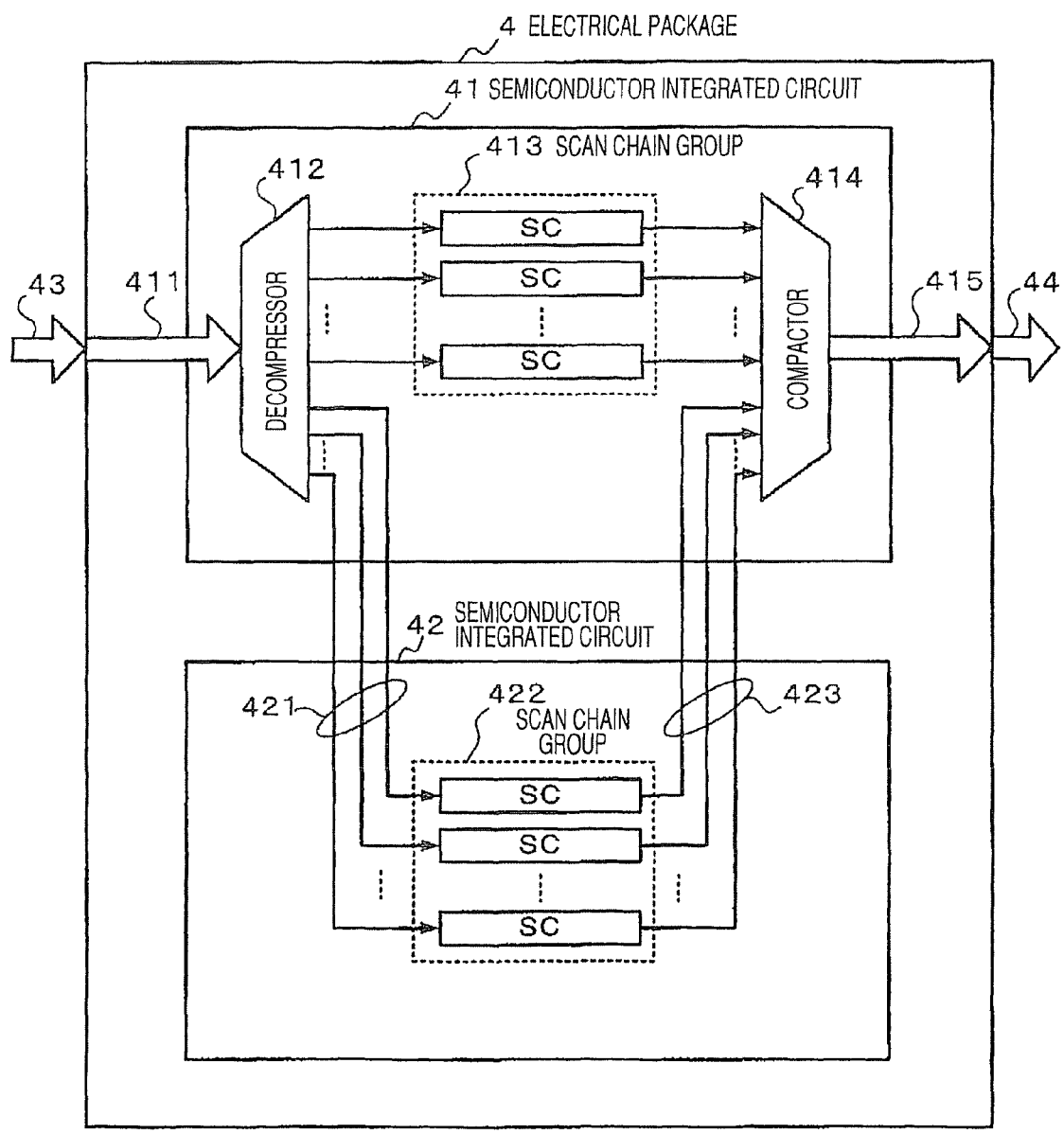
FIG. 10 is an exemplary block diagram showing an embodiment of a structure of a package according to a fourth embodiment of the invention.

FIG. 10 is a block diagram showing an embodiment of a structure of a package according to a fourth embodiment of the invention.

A package 4 mounts a compressed deterministic pattern test compatible semiconductor integrated circuit 41 and a compressed deterministic pattern test non-compatible semiconductor integrated circuit 42, and comprises an external scan input terminal 43 and an external scan output terminal 44.

The semiconductor integrated circuit 41 includes a scan input terminal 411, an decompressor 412 for a compressed deterministic pattern test which is connected to the scan input terminal 411, a scan chain group 413 having a plurality of scan chains (SCs) to which outputs of the decompressor 412 are loaded respectively, a compactor 414 for a compressed deterministic pattern test to which scan outputs from the scan chain group 413 are input, and a scan output terminal 415 to which an output of the compactor 414 is input.

The semiconductor integrated circuit 42 includes a scan input terminal 421, a scan chain group 422 having a plurality of scan chains (SCs) to which scan data are input from the scan input terminal 421, and a scan output terminal 423 through which scan output data from the scan chain group 422 are output.

The scan input terminal 421 of the semiconductor integrated circuit 42 is connected to a part of outputs of the decompressor 412 of the semiconductor integrated circuit 41 and the scan output terminal 423 of the semiconductor integrated circuit 42 is connected to the compactor 414 of the semiconductor integrated circuit 41.

Although the semiconductor integrated circuit 42 is originally compressed deterministic pattern test non-compatible, consequently, it is possible to carry out a scan test through a compressed deterministic pattern test technique.

When the scan test through the compressed deterministic pattern test technique of the semiconductor integrated circuit 42 is to be carried out, compression scan data for the semiconductor integrated circuit 42 are input from the external scan input terminal 43 to the decompressor 412 through the scan input terminal 411 together with the compressed test data for the semiconductor integrated circuit 41. Upon receipt of the input, the decompressor 412 generates scan test data to be distributed to each of the scan chains (SCs) of the scan chain group 422 of the semiconductor integrated circuit 42 together with scan test data to be distributed to each of the scan chains (SCs) of the scan chain group 413 of the semiconductor integrated circuit 41.

In each of the scan chains (SCs) of the scan chain group 422 of the semiconductor integrated circuit 42, the scan test is executed based on the scan test data distributed from the decompressor 412.

A result of the execution is output to the compactor 414 of the semiconductor integrated circuit 41 through the scan output terminal 423 and is then compressed through the compactor 414. The compressed data are unloaded to the scan output terminal 415 and are thereafter output to the external scan output terminal 44 of the package 4.

According to the embodiment, it is possible to execute the scan test through the compressed deterministic pattern test technique for the compressed deterministic pattern test non-compatible semiconductor integrated circuit by an integration with the compressed deterministic pattern test compatible semiconductor integrated circuit. Consequently, it is possible to reduce a test time and a test data volume for the package.

Figure 13:
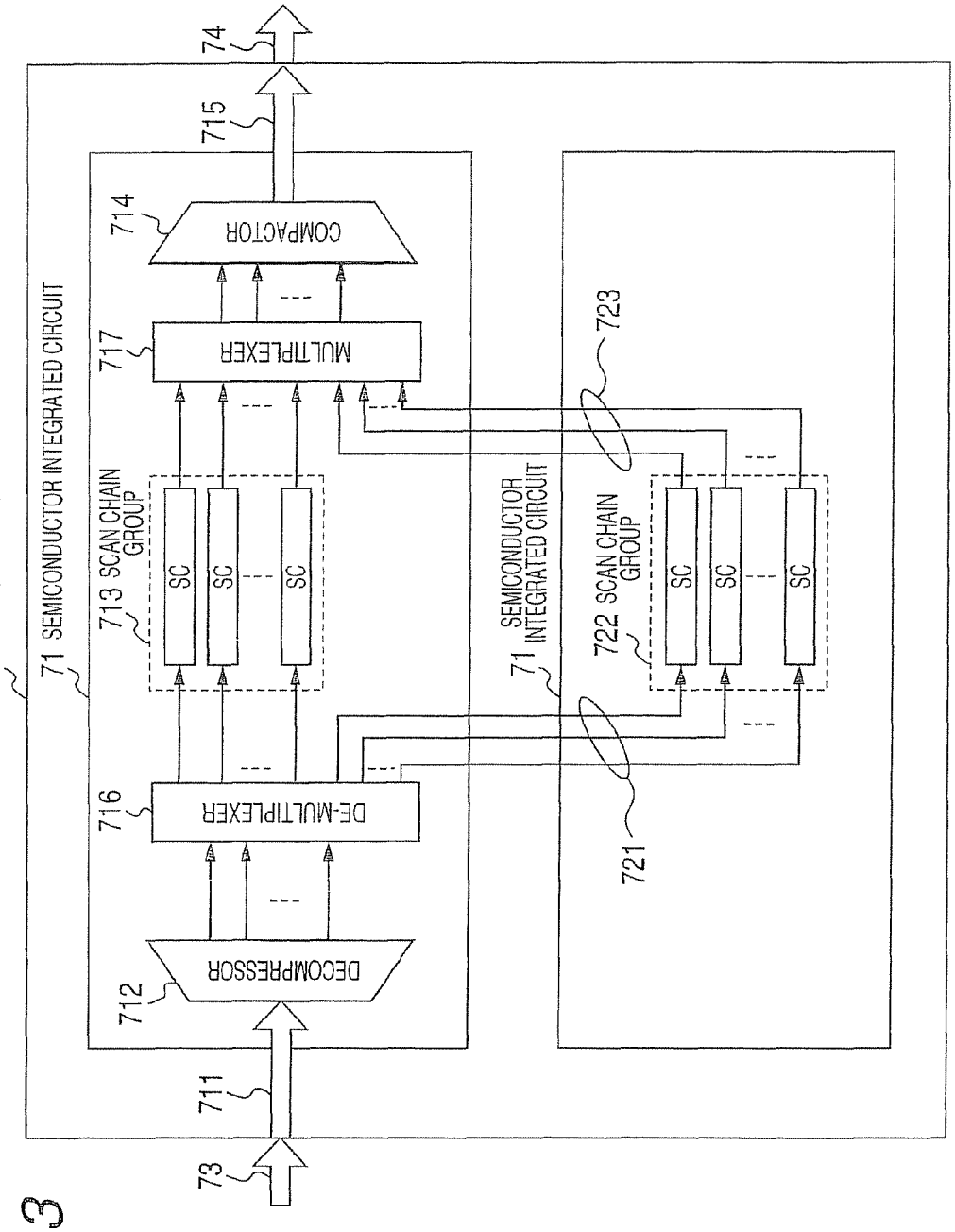
FIG. 13 is an exemplary block diagram showing a variant of a structure of a package according to the fourth embodiment of the invention.

As shown in FIG. 13, a semiconductor integrated circuit 71 may include multiplexers to selectively scan a scan chain 713 or a scan chain 722.

Fifth Embodiment

In the first to fourth embodiments, there have been described the embodiments of the package in which at least one compressed deterministic pattern test compatible semiconductor integrated circuit is assembled in the package and the scan test using the compressed deterministic pattern test technique for all of the assembled semiconductor integrated circuits can be carried out by utilizing the compressed deterministic pattern test compatible semiconductor integrated circuit. On the other hand, in the embodiment, there will be described an embodiment of a package capable of executing a scan test through a compressed deterministic pattern test technique of a compressed deterministic pattern test non-compatible semiconductor integrated circuit also in the case in which only the same semiconductor integrated circuit is assembled in the package.

Figure 11:
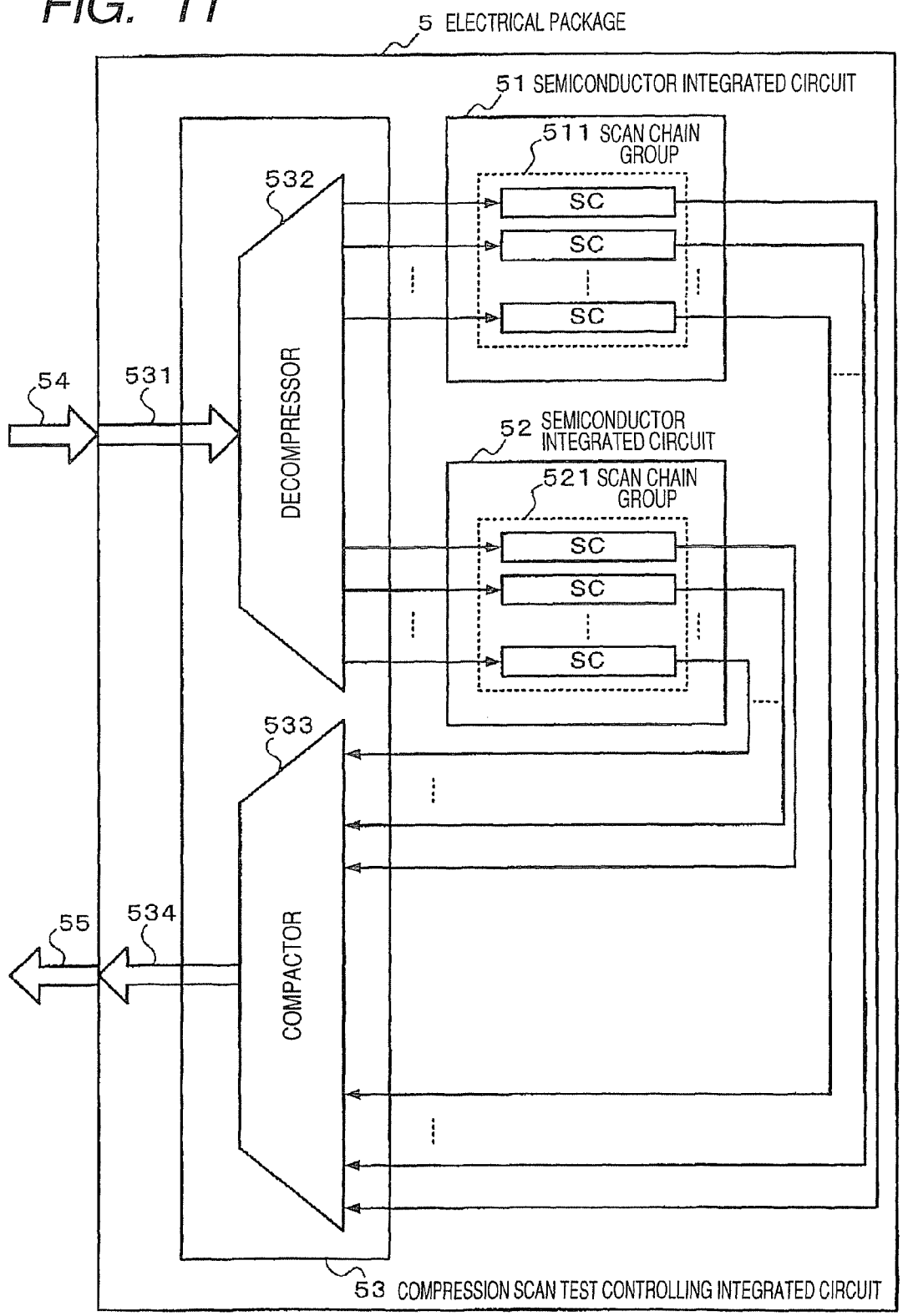
FIG. 11 is an exemplary block diagram showing an embodiment of a structure of a package according to a fifth embodiment of the invention.

FIG. 11 is a block diagram showing an embodiment of a structure of a package according to a fifth embodiment of the invention.

A package 5 according to the embodiment mounts only a compressed deterministic pattern test non-compatible semiconductor integrated circuit as a functional element and has semiconductor integrated circuits 51 and 52, for embodiment.

The semiconductor integrated circuits 51 and 52 have scan chain groups 511 and 521, each of which has a plurality of scan chains (SCs).

In order to enable a scan test using a compressed deterministic pattern test technique for the scan chain groups 511 and 521, the package 5 according to the embodiment mounts a compressed deterministic pattern test controlling integrated circuit 53 having a decompressor 532 and a compactor 533.

The compressed deterministic pattern test controlling integrated circuit 53 has a scan input terminal 531 to which an input of the decompressor 532 is connected and a scan output terminal 534 to which an output of the compactor 533 is connected. The scan input terminal 531 is connected to an external scan input terminal 54 of the package 5 and the scan output terminal 534 is connected to an external scan output terminal 55 of the package 5.

An output of the decompressor 532 of the compressed deterministic pattern test controlling integrated circuit 53 is connected to an input of the scan chain group 511 of the semiconductor integrated circuit 51 and that of the scan chain group 521 of the semiconductor integrated circuit 52, and an output of the scan chain group 511 and that of the scan chain group 521 are connected to an input of the compactor 533 of the compressed deterministic pattern test controlling integrated circuit 53.

In the package 5, when the scan test using the compressed deterministic pattern test technique for the semiconductor integrated circuits 51 and 52 is to be executed, compressed test data are loaded from the external scan input terminal 54 to the decompressor 532 through the scan input terminal 531 of the compressed deterministic pattern test controlling integrated circuit 53.

The decompressor 532 decompresses the compressed test data and distributes a scan test pattern to the scan chain group 511 of the semiconductor integrated circuit 51 and the scan chain group 521 of the semiconductor integrated circuit 52.

Based on the scan test pattern, a scan test in the scan chain group 511 and the scan chain group 521 is executed.

A result of the scan test is unloaded from the scan chain group 511 and the scan chain group 521 to the compactor 533 of the compressed deterministic pattern test controlling integrated circuit 53.

The compactor 533 compresses the result of the scan test thus input and outputs the compressed result to the external scan output terminal 55 of the package 5 through the scan output terminal 534.

Thus, the compressed deterministic pattern test for the semiconductor integrated circuits 51 and 52 is executed by using the external scan input terminal 54 and the external scan output terminal 55 in the package 5.

According to the embodiment, it is possible to carry out the scan test using the compressed deterministic pattern test technique of the compressed deterministic pattern test non-compatible semiconductor integrated circuit by mounting the semiconductor integrated circuit having the decompressor and the compactor in addition to the compressed deterministic pattern test non-compatible semiconductor integrated circuit to be mounted as the functional element. Moreover, logical operations for the semiconductor integrated circuits can also be tested at the same time. Consequently, it is possible to reduce a test time and a test data volume for the package.

As described with reference to the above embodiments, there is provided a package capable of carrying out a compressed deterministic pattern test for each of semiconductor integrated circuits which are stored without increasing external scan input/output terminals.

Consequently, it is possible to carry out a compressed deterministic pattern test for each of semiconductor integrated circuits which are appended without increasing external scan input/output terminals.

What is claimed is:

1. An electrical package comprising:
an external input portion;

an external output portion;
a plurality of integrated circuits that is compatible with a compressed deterministic pattern test, each of the integrated circuits including:
an input portion;
a decompressor that is connected to a part of the input portion;
scan chains that are connected to the decompressor;
a compactor that is connected to the scan chains;
a selector that is connected to the compactor and the part of the input portion to selectively output an output of the compactor or an output of the part of the input portion; and
an output portion that is connected to the selector,
wherein the integrated circuits are serially connected so that the output portion of the integrated circuit is connected to the input portion of the subsequent integrated circuit to form a sequential path, wherein the input portion of the integrated circuit configuring an initial stage of the sequential path is connected to the external input portion; and
wherein the output portion of the integrated circuit configuring a final stage of the sequential path is connected to the external output portion.

2. The electrical package according to claim 1, wherein each of the integrated circuits further includes:
a first additional selector that is connected to the part of the input portion, the decompressor and the selector to selectively output an output of the part of the input portion and an output of the decompressor to the selector;
a second additional selector that is connected to the part of the input portion, the scan chain, and the compactor to selectively output an output of the part of the input portion and an output of the scan chain to the compactor.

3. The electrical package according to claim 1, wherein each of the integrated circuits except the integrated circuit configuring a final stage of the sequential path further includes a register between the selector and the output portion.

4. The electrical package according to claim 1, wherein, when the scan chain included in a given integrated circuit is scanned, the selector included in the given integrated circuit is set to output the compacted test result.

5. The electrical package according to claim 1, wherein, when the scan chain included in each of the integrated circuit except the given integrated circuit is scanned, the selector included in the given integrated circuit is set to output the output data of the input portion.

6. An electrical package comprising:
an external input portion to which compressed test data is loaded;
an external output portion configured to output compacted test result;
a first integrated circuit that is compatible with a compressed deterministic pattern test, the first integrated circuit including:
a first input portion that is connected to the external input portion to receive the compressed test data;
a first decompressor that is connected to a part of the first input portion to—decompress the compressed test data, and that outputs first test data;
a first scan chain that is connected to the first decompressor to receive the first test data, and that outputs a first test result; a first compactor that is connected to the first scan chain to compact the first test result, and that outputs first compacted test result;
a first selector that is connected to the part of the first input portion and the first decompressor to selectively output the first test data or the compressed test data as a first selector output;
a second selector that is connected to the first compactor and the first selector to selectively output the first compacted test result or the first selector output as a second selector output; and
a first output portion that is connected to the second selector and that outputs the second selector output as a first circuit output, a second integrated circuit that is non-compatible with the compressed deterministic pattern test, the second integrated circuit including:
a second input portion that is connected to the first output portion to receive the first circuit output;
a second scan chain that is connected to a part of the second input portion to receive the first test data, and that outputs a second test result;
a third selector that is connected to the second scan chain and the part of the second input portion to selectively output the second test result or the first circuit output as a third selector output;
a second output portion that is connected to the third selector, and that outputs the third selector output as a second circuit output, a third integrated circuit that is compatible with the compressed deterministic pattern test, the third integrated circuit including:
a third input portion that is connected to the second output portion to receive the second circuit output;
a third decompressor that is connected to a part of the third input portion to decompress the compressed test data, and that outputs third test data;
a third scan chain that is connected to the third decompressor to receive the third test data and that outputs a third test result;
a fourth selector that is connected to the third scan chain and the third input portion to selectively output the second test result or the third test result as a fourth selector output;
a third compactor that is connected to the fourth selector to compress the fourth selector output, and that outputs a third compacted test result;
a fifth selector that is connected to the third compactor and the part of the third input portion to selectively output the first compacted test result or the third compacted test result as a fifth selector output; and
a third output portion that is connected to the fifth selector, and that outputs the fifth selector output to the external output portion as the compacted test result.

7. The electrical package according to claim 6, wherein the first integrated circuit further includes a register between the first selector and the first output portion to absorb a delay of the first selector output.

8. The electrical package according to claim 6, wherein the second integrated circuit further includes a register between the second selector and the second output portion to absorb a delay of the second selector output.

9. The electrical package according to claim 6, wherein, when the first scan chain is scanned:
the second selector is set to output the first compacted test result;
the third selector is set to output the first circuit output; and
the fifth selector is set to output the first compacted test result.

10. The electrical package according to claim 6, wherein, when the second scan chain is scanned:
the first selector is set to output the first test data;

the second selector is set to output the first selector output;
the third selector is set to output the second test result;
the fourth selector is set to output the second test result; and
the fifth selector is set to output the third compacted test result.

11. The electrical package according to claim 6, wherein, when the third scan chain is scanned:

the first selector outputs the compressed test data;
the second selector outputs the first selector output;
the third selector outputs the first circuit output;
the fourth selector outputs the third test result; and
the fifth selector outputs the third compacted test result.

* * * * *